United States Patent
Sarti (10) Patent No.: US 9,986,658 B2
(45) Date of Patent: May 29, 2018

(54) POWER CONNECTION CLIP FOR A SHELF IN A SERVER RACK

(71) Applicant: Facebook, Inc., Menlo Park, CA (US)

(72) Inventor: Pierluigi Sarti, Milpitas, CA (US)

(73) Assignee: Facebook, Inc, Menlo Park, CA (US)

( * ) Notice: Subject to any disclaimer, the term of this patent is extended or adjusted under 35 U.S.C. 154(b) by 217 days.

(21) Appl. No.: 14/958,648

(22) Filed: Dec. 3, 2015

(65) Prior Publication Data

US 2017/0164505 A1 Jun. 8, 2017

(51) Int. Cl.
*H05K 7/00* (2006.01)
*H05K 7/14* (2006.01)

(52) U.S. Cl.
CPC .................. *H05K 7/1492* (2013.01)

(58) Field of Classification Search
None
See application file for complete search history.

(56) References Cited

U.S. PATENT DOCUMENTS

| | | | |
|---|---|---|---|
| 4,180,846 A * | 12/1979 | Wilson | H02B 1/36 361/614 |
| 5,196,987 A * | 3/1993 | Webber | H01R 25/16 361/624 |
| 5,646,509 A | 7/1997 | Berglund et al. | |
| 6,239,579 B1 | 5/2001 | Dunn et al. | |
| 6,295,215 B1 | 9/2001 | Faria et al. | |
| 6,340,306 B1 * | 1/2002 | Daoud | H01R 13/6273 439/219 |
| 6,347,950 B1 * | 2/2002 | Yokoyama | H01R 13/6315 439/248 |
| 7,500,867 B1 * | 3/2009 | Doglio | H01R 13/5812 248/251 |
| 7,581,972 B2 * | 9/2009 | Daamen | H01R 13/6315 439/249 |
| 7,880,438 B1 | 2/2011 | Cohen et al. | |
| 7,892,108 B2 | 2/2011 | Kuo | |

(Continued)

OTHER PUBLICATIONS

Choi, et al.: "New 24-Pulse Diode Rectifier Systems for Utility Interface of High-Power AC Motor Drives." IEEE Transactions on Industry Applications, vol. 33, No. 2, Mar./Apr. 1997, 11 pages.

(Continued)

*Primary Examiner* — Courtney Smith
*Assistant Examiner* — Rashen E Morrison
(74) *Attorney, Agent, or Firm* — FisherBroyles, LLP (57) ABSTRACT

Various embodiments include a power connection clip to electrically couple a power distribution board of an information technology (IT) equipment shelf to a plurality of power rails/buses in a server rack. The power connection clip can include a clip body having an inner portion and an outer portion, a shelf coupler, and an electrical conductor pair. The outer portion can include at least two clip fins separated from a central stump to form at least two cavities. The shelf coupler can couple the clip body to the IT equipment shelf. The electrical conductor pair can sandwich at least the inner portion of the clip body. The electrical conductor pair is adapted to carry high-voltage direct current (HVDC) voltage. The cavities can be covered with electrical conductors. The electrical conductors in the cavities can be adapted to carry IT-usable direct current (DC) voltage.

19 Claims, 6 Drawing Sheets

(56) References Cited

U.S. PATENT DOCUMENTS

| | | | |
|---|---|---|---|
| 7,974,796 B2 | 7/2011 | Tamai | |
| 8,879,241 B2* | 11/2014 | Lu | G06F 1/181 |
| | | | 174/149 B |
| 8,911,250 B2* | 12/2014 | Ehlen | H01R 13/6315 |
| | | | 439/248 |
| 9,110,107 B2 | 8/2015 | Busca et al. | |
| 9,148,068 B2 | 9/2015 | Sarti et al. | |
| 9,320,166 B1 | 4/2016 | Marr et al. | |
| 9,331,409 B2* | 5/2016 | Naganuma | H01R 12/7047 |
| 9,337,597 B2* | 5/2016 | Daamen | H01R 27/02 |
| 9,489,024 B2* | 11/2016 | Tsai | G06F 1/26 |
| 9,552,031 B2 | 1/2017 | Sarti et al. | |
| 9,590,370 B1* | 3/2017 | Lee | H01R 25/142 |
| 9,622,373 B1 | 4/2017 | Sarti et al. | |
| 9,698,577 B2* | 7/2017 | Yi | H02B 1/20 |
| 9,703,750 B2* | 7/2017 | Chu | G06F 1/12 |
| 2002/0171985 A1 | 11/2002 | Duffy et al. | |
| 2003/0197428 A1 | 10/2003 | Hatton et al. | |
| 2005/0146223 A1 | 7/2005 | Kanouda et al. | |
| 2005/0162830 A1 | 7/2005 | Wortman et al. | |
| 2005/0221629 A1* | 10/2005 | Woellner | H01R 13/639 |
| | | | 439/10 |
| 2006/0120170 A1* | 6/2006 | Chen | G06F 1/187 |
| | | | 365/189.05 |
| 2009/0164820 A1 | 6/2009 | Abraham et al. | |
| 2011/0057724 A1 | 3/2011 | Pabon et al. | |
| 2012/0013186 A1 | 1/2012 | Sarti et al. | |
| 2012/0153720 A1 | 6/2012 | Chang et al. | |
| 2012/0290236 A1 | 11/2012 | Majima et al. | |
| 2013/0058028 A1* | 3/2013 | Lu | G06F 1/181 |
| | | | 361/679.31 |
| 2013/0154365 A1 | 6/2013 | Sarti et al. | |
| 2013/0227309 A1 | 8/2013 | Jau et al. | |
| 2013/0279129 A1* | 10/2013 | Xie | G06F 1/16 |
| | | | 361/752 |
| 2014/0099806 A1* | 4/2014 | Ehlen | H01R 13/6315 |
| | | | 439/121 |
| 2015/0036272 A1* | 2/2015 | Tachibana | G06F 1/189 |
| | | | 361/679.4 |
| 2015/0177808 A1 | 6/2015 | Sarti et al. | |
| 2015/0180233 A1 | 6/2015 | Yamada et al. | |
| 2015/0180234 A1* | 6/2015 | Bailey | H02J 1/10 |
| | | | 307/12 |
| 2015/0245531 A1* | 8/2015 | Meinecke | H02M 3/158 |
| | | | 361/679.02 |
| 2016/0187945 A1* | 6/2016 | Tsai | G06F 1/26 |
| | | | 713/310 |
| 2016/0262282 A1* | 9/2016 | Li | H01R 43/205 |
| 2016/0329689 A1* | 11/2016 | Yi | H02B 1/20 |
| 2017/0074946 A1 | 3/2017 | Ebrahimzadeh et al. | |
| 2017/0094829 A1 | 3/2017 | Sarti | |
| 2017/0098956 A1 | 4/2017 | Sarti | |
| 2017/0332510 A1 | 11/2017 | Sarti | |

OTHER PUBLICATIONS

Non-Final Office Action dated Jun. 10, 2016, for U.S. Appl. No. 14/251,174 by Sarti. et al., filed Apr. 11, 2014.
U.S. Appl. No. 15/153,348 of Sarti, P., et al., filed May 12, 2016.
Notice of Allowance dated Jun. 23, 2015, for U.S. Appl. No. 13/693,530 of Sarti, P. filed Dec. 4, 2012.
U.S. Appl. No. 13/693,530 of Sarti, P. filed Dec. 4, 2012.
U.S. Appl. No. 14/251,174 of Sarti, P. filed Apr. 11, 2014.
U.S. Appl. No. 14/853,526 of Ebrahimzadeh, S. filed Sep. 14, 2015.
U.S. Appl. No. 14/873,585 of Sarti, P. filed Oct. 2, 2015.
U.S. Appl. No. 14/941,005 of Sarti, P. filed Nov. 13, 2015.
Restriction Requirement dated Apr. 7, 2016, for U.S. Appl. No. 14/251,174 by Sarti. et al., filed Apr. 11, 2014.
Non-Final Office Action dated Mar. 17, 2017, for U.S. Appl. No. 14/853,526 by Ebrahimzadeh. et al., filed Sep. 14, 2015.
Corrected Notice of Allowability dated Feb. 24, 2017, for U.S. Appl. No. 14/941,005 of Sarti, P. filed Nov. 13, 2015.
Notice of Allowance dated Feb. 1, 2017 of U.S. Appl. No. 14/941,005 by Sarti, P., filed Nov. 13, 2015.
U.S. Appl. No. 15/377,957 by Sarti, P., filed Dec. 13, 2016.
Final Office Action dated Sep. 14, 2017 for U.S. Appl. No. 14/853,526 by Ebrahimzadeh, S. et al. filed Sep. 14, 2015.
Restriction Requirement dated Oct. 23, 2017, for U.S. Appl. No. 14/873,585 by Sarti. et al., filed Oct. 2, 2015.
Restriction Requirement dated Oct. 31, 2017, for U.S. Appl. No. 15/153,348 by Sarti. et al., filed May 12, 2016.

* cited by examiner

POWER CONNECTION CLIP FOR A SHELF IN A SERVER RACK

CROSS-REFERENCE TO RELATED APPLICATION(S)

This application relates to U.S. patent application Ser. No. 14/941,005, entitled "HIGH VOLTAGE DIRECT CURRENT POWER SYSTEM FOR DATA CENTERS," filed Nov. 13, 2015, which is incorporated by reference herein in its entirety.

BACKGROUND

A data center is a practical solution for cloud computing, large-scale application services, and/or data services in information technology (IT) operations. One of the challenges of a data center is to provide uninterrupted power to computer server racks in the data center. Traditionally, a data center is connected to an alternating current (AC) grid. A server rack in the traditional data center converts the AC power to IT-usable direct current (DC) power via power supply modules. To ensure redundancy, the server rack includes multiple power supply modules in multiple power shelves in the server rack. The server rack can also include battery backup units (BBUs) that provide backup power when the power supply modules fail or when the AC grid experiences an outage or failure. The BBUs are often times placed in the power shelves as well. The power supply modules and the BBUs are heavy components that are difficult to maintain, but generally last longer than computing servers in a server rack. They eventually need to be replaced and doing so is expensive. The bulky power shelves in the server rack can take up scarce real estate in the server rack and have a low power efficiency that makes the power consumption by computing devices in the server rack costly.

The figures depict various embodiments of the disclosure for purposes of illustration only. One skilled in the art will readily recognize from the following discussion that alternative embodiments of the structures and methods illustrated herein may be employed without departing from the principles of the invention described herein.

DETAILED DESCRIPTION

Embodiments include a server rack architecture that uses a power connection clip to supply high voltage direct current (HVDC) power (e.g., more than 250V of electric potential) to an IT equipment shelf and enable multiple IT equipment shelves to share IT-usable DC power (e.g., 12V or 12.5V, or any voltages less than the safety extra low voltage (SELV) threshold, such as 60V DC) with each other. A power distribution board coupled to one or more replaceable DC-DC converters can convert the HVDC power to IT-usable DC power for the IT load therein (e.g., to supply power to computer servers, network equipment, data storage devices, network appliances, or any combination thereof). In some embodiments, the HVDC power is more than double the IT-usable DC voltage (e.g., standardized voltage used by IT equipment). For example, the power connection clip can receive the HVDC power from a HVDC power rail pair. The HVDC power rail pair can traverse or cross multiple IT equipment shelves within a power domain (e.g., a group of IT equipment shelves) of the server rack. The IT-usable DC power generated by the hot-plug replaceable DC-DC converters can be re-shared amongst the IT equipment shelves via an IT power bus pair installed in the rack. The IT power bus pair can also traverse or cross the IT equipment shelves in the power domain. A power domain is a region of a server rack that has one or more independent power components that are isolated from other regions of the server rack. In some embodiments, the server rack has a single power domain. In other embodiments, the server rack has multiple power domains for isolating potential effects of power equipment failure. The server rack, for an example, has two power domains.

Various embodiments include a power connection clip that couples with the HVDC power rail pair and/or the IT power bus pair. The power connection clip can have a clip body having at least a central stump and two clip fins. The central stump and each of the clip fins form two cavities, serving as two clip-side female receptors (e.g., normally used at low voltage <60V DC, and high current). Outside of the clip fins can be two electrical conductor protrusions serving as clip-side male connectors (e.g., normally used for HVDC, which can be greater than 250V DC and less than 800V DC). The server rack can have four electrical power rails (e.g., an inner pair and an outer pair). In some embodiments, the inner pair are the HVDC power rail pair and the outer pair are the IT power bus pair. In other embodiments, the inner pair are the IT power bus pair and the outer pair are the HVDC power rail pair, as in the example described herein. In some examples, the inner pair have a pair of blade protrusions configured to plug into the clip-side female receptors of the power connection clip. The outer pair can have long slits configured to receive the clip-side male connectors of the power connection clip. In other examples, the inner pair can have the long slits and the outer pair can have the blade protrusions.

The disclosed server rack architecture removes the need of using AC-DC conversion power shelves and thus is able to reduce at least one or more rack unit slots (RU) of rack space, or one or more Open Units (OU) for OCP open racks, compared to the traditional server rack architectural layouts. An "OU" is an unit of rack space in accordance with the Open Rack standard of the Open Compute Project. The disclosed power connection clip enables cross-shelf power redundancy by sharing the IT-usable DC power from shelf to shelf utilizing the IT power bus pair. The maximum rack power is scalable depending on how many DC-DC converter modules are actually installed in the rack. The disclosed power connection clip can enable the same flexibility for the level of the power redundancy scheme. The disclosed HVDC power path experiences a lower conduction loss than the traditional low-voltage DC power path. For example, the traditional DC 12V power path may experience a 1.5%~1.6% conduction loss at full load best case, or worse, while the disclosed HVDC power path may experience only a 0.3% to 0.4% conduction loss max. The disclosed server rack architecture has a higher number of power converters (e.g., DC-DC converters) than the traditional server rack architecture (e.g., AC-DC converters). Because of this, when redundancy is lost, each traditional server rack architecture supports a lower maximum peak power (e.g., 13.2 kW of peak power) as compared to the disclosed server rack architecture (e.g., 22.5 kW of peak power). The disclosed power connection clip enables maximum rack power and extremely flexible level of redundancy. In some embodiments, because the disclosed server rack architecture integrates the DC-DC converters in the IT equipment shelves, shelves in a server rack under this architecture can include up to a maximum of 16 shelves with power conversion equipment.

Figure 1:
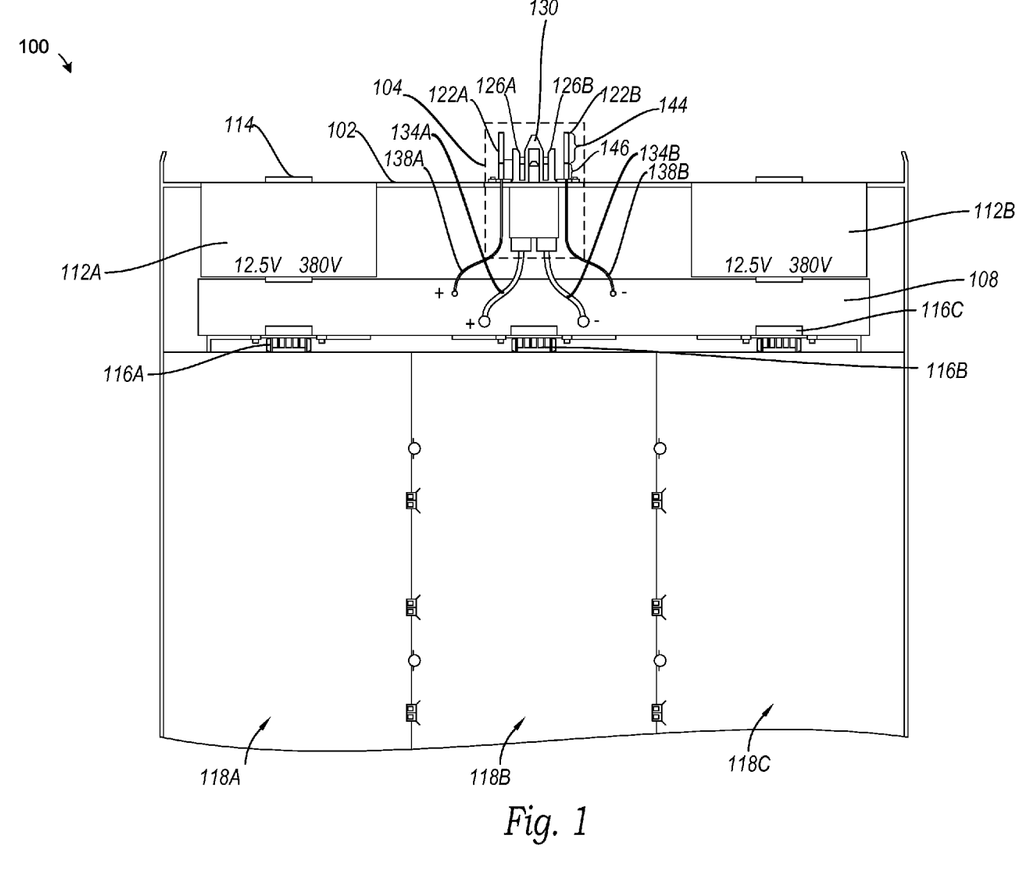
FIG. 1 is a block diagram illustrating an example of an IT equipment shelf, in accordance with various embodiments.

Turning now to the figures, FIG. 1 is a block diagram illustrating an example of an IT equipment shelf 100, in accordance with various embodiments. The IT equipment shelf 100 can include a rear panel 102. A power connection clip 104 can be exposed through the rear panel 102. The power connection clip 104 can be adapted to access HVDC power from a power rail pair crossing IT equipment shelves in a server rack. The power connection clip 104 can further be adapted to access or provide backup IT-usable DC power via an IT power bus pair traversing or crossing the IT equipment shelves in the server rack (e.g., low voltage path).

The IT equipment shelf 100 can include a power distribution board 108 (e.g., a printed circuit board (PCB)). The power distribution board 108 can be electrically coupled to the power connection clip 104, enabling the power distribution board 108 to access the HVDC power. For example, the power connection clip 104 can include a positive HVDC terminal and a negative HVDC terminal corresponding to a positive HVDC terminal and a negative HVDC terminal on the power distribution board 108. The power connection clip 104 can include a positive IT-usable terminal and a negative IT-usable terminal corresponding to a positive IT-usable terminal and a negative IT-usable terminal on the power distribution board 108 (e.g., low voltage path).

The IT equipment shelf 100 can include a step down DC-DC converter 112A and a step down DC-DC converter 112B (collectively as the "step down DC-DC converters 112"), both electrically coupled to the power distribution board 108. The step down DC-DC converters 112 can be adapted to convert the HVDC power to an IT-usable DC power at a lower voltage compared to the HVDC power. The step down DC-DC converters 112 can be hot pluggable/hot swappable through the rear panel 102 to the power distribution board 108. That is, when one of the step down DC-DC converters 112 is removed from or coupled to the power distribution board 108, the IT devices of the IT equipment shelf 100 can continue to function without interruption, and also powered by the remaining DC-DC converters installed in the remaining shelves within the same power zone. The step down DC-DC converters 112 can blindly mate with the power distribution board 108. In some embodiments, each of the step down DC-DC converters 112 includes a handle 114. The handle 114 enables an IT personnel to remove a failed step down DC-DC converter easily, from the hot side of the rack (e.g., the rear side). The IT personnel can then insert a new step down DC-DC converter through an opening in the rear panel 102 to couple with the power distribution board 108.

The power distribution board 108 can include IT power distribution connectors (e.g., an IT power distribution connector 116A, an IT power distribution connector 116B, and an IT power distribution connector 116C, collectively as the "IT power distribution connectors 116"). The IT power distribution connectors 116 can be PCB board-mount connectors, and mate with the corresponding connector installed in each of the IT tray devices, normally panel-mount and slightly floating for blind-mating of the tray, from the front of the rack. Each of the IT power distribution connectors 116 can electrically couple the power distribution board 108 to one or more IT devices (not shown). Each of the IT power distribution connectors 116 can be adapted to provide the IT-usable DC power to an IT device in an IT tray of the IT equipment shelf 100. In the illustrated example, the IT equipment shelf 100 can include three IT trays (e.g., an IT tray 118A, an IT tray 118B, and an IT tray 118C, collectively as the "IT trays 118"). The IT power distribution connectors 116 are installed (and can float) on rear panel of the IT trays 118. Each of the IT power distribution connectors 116 can provide 12V of DC power to an IT device. For example, the IT device can draw an average of 300 W or a peak of 500 W from its corresponding IT power distribution connector.

The power distribution board 108 can be adapted to share the IT-usable DC power provided by the step down DC-DC converters 112 back to the IT power bus pair via the power connection clip 104. This sharing of the IT-usable DC power enables the server rack to have cross-shelf power redundancy. The cross-shelf power redundancy ensures that an IT equipment node is agnostic of where it is drawing its power. For example, the power distribution board 108 can be adapted to draw the backup IT-usable DC power when the step down DC-DC converters 112 (e.g., or higher number of those converter) fail.

The power connection clip 104 includes an inner portion (e.g., shelf-facing side) and an outer portion (e.g., an external side). The outer portion is exposed through an opening in the rear panel 102. For example, the outer portion includes a pair of electrical conductors (e.g., an electrical conductor prong 122A and an electrical conductor prong 122B, collectively as the "electrical conductor prongs 122"). The electrical conductor prongs 122 can protrude away from the rear panel 102. The outer portion can also include a pair of clip fins (e.g., a clip fin 126A and a clip fin 126B, collectively as the "clip fins 126"). The outer portion can include a central stump 130 between the clip fins 126. In various embodiments, the electrical conductor prongs 122, the clip fins 126, and the central stump 130 all protrude away from the rear panel 102. In the illustrated example, the electrical conductor prongs 122 are the outermost pair of protrusions. In some embodiments, layers of insulation on the electrical conductor prongs 122 are placed to ensure no voltage is accessible to operator touch, during shelf mating in the rack, and after the shelf is fully mated to the rack and in place.

In some embodiments, the clip fins 126 are electrically conductive. In some embodiments, the clip fins 126 are electrical insulators (e.g., plastic) coated with or covered by electrical conductors in the divots between the clip fins 126 and the central stump 130. These electrical contacts of the clip fins 126 can enable the power connection clip 104 to serve as an electrical bridge between power buses of a server rack that the IT equipment shelf is in and the power distribution board 108. For example, a first pair of wires (e.g., a wire 134A and a wire 134B, collectively as the "wires 134") can connect the electrical contacts of the clip fins 126 to the power distribution board 108. Similarly, a second pair of wires (e.g., a wire 138A and a wire 138B, collectively as the "wires 138") can connect the electrical conductor prongs 122 and the power distribution board 108. In some embodiments, the wires 138 are attached because the power connection clip 104, installed panel-mount to the rear side of the shelf, can mechanically float to enable blind-mating of the shelf to the rack.

In some embodiments, each of the electrical conductor prongs (e.g., blades) 122 includes a tip portion 144 and a rear portion 146. The body of the electrical conductor prongs 122 can be electrically conductive. In some embodiments, the tip portion 144 is coated with a rust resistant electrical conductor (e.g., nickel) and the rear portion 146 is coated with an electrical insulator to prevent electrical shorts with nearby electrical conductors. For example, each of the electrical conductor prongs 122 can be a copper bar with nickel plating at the tip portion 144 and electrical insulation coating at the rear portion 146.

Figure 2:
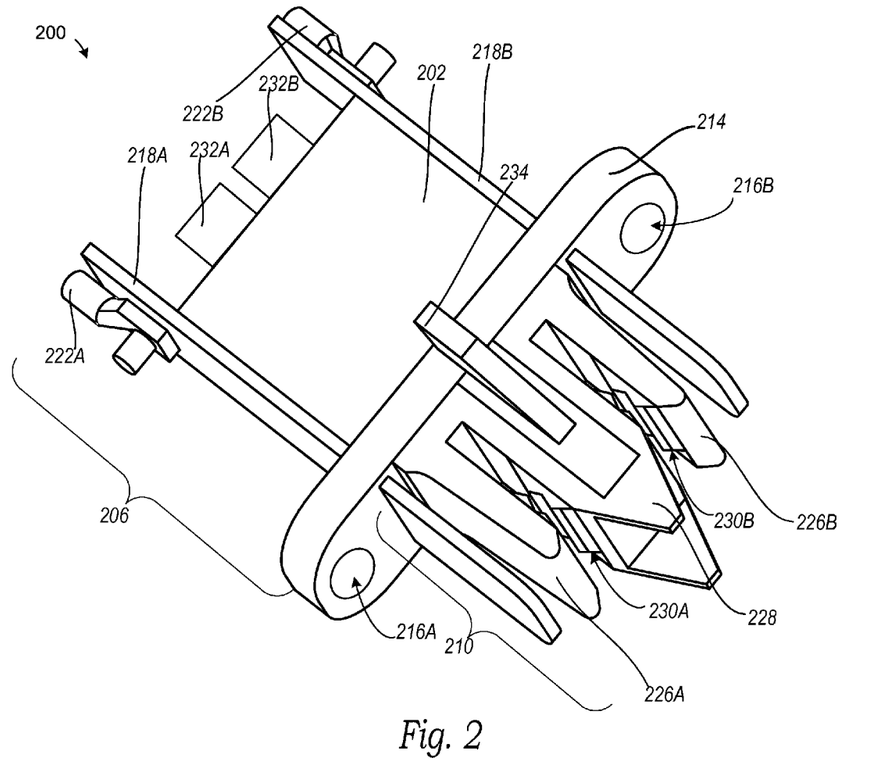
FIG. 2 is a perspective view illustrating an example of a power connection clip, in accordance with various embodiments.

FIG. 2 is a perspective view illustrating an example of a power connection clip 200, in accordance with various embodiments. The power connection clip 200 can be adapted to mechanically couple to a server shelf (e.g., the IT equipment shelf 100) and a plurality of power rails of a server rack. The power connection clip 200 can have a clip body 202 having an inner portion 206 and an outer portion 210. In some embodiments, the clip body 202 is an electrical insulator. The outer portion 210 is adapted to protrude outside of the server shelf and the inner portion 206 is adapted to extend inside the server shelf. In various embodiments, the separation of the outer portion 210 and the inner portion 206 can be marked by a shelf coupler 214. The shelf coupler 214 can be a modular attachment mechanism for mechanically coupling the power connection clip 200 to the wall of the server shelf, e.g., with slight floating action for blind-mating of the shelf from the front of the rack. The shelf coupler 214 can attach and/or detach from the wall of the server shelf without damaging structural material of the power connection clip 200 or of the wall of the server shelf.

In some embodiments, the shelf coupler 214 can be attached to the clip body 202 between the inner portion 206 and the outer portion 210. In some embodiments, the shelf coupler 214 is integrated with the clip body 202 between the inner portion 206 and the outer portion 210. The shelf coupler 214 can be adapted to surround the clip body 202. The shelf coupler 214 can be adapted to mechanically attach and/or detach the clip body 202 from a wall of the server shelf. The shelf coupler 214 can have one or more holes (e.g., a hole 216A and a hole 216B, collective as the "holes 216") that facilitate coupling mechanisms (e.g., bolts or screws) to mechanically couple the shelf coupler 214 to the wall of the server shelf. The holes 216 can penetrate at least two surfaces of the shelf coupler 214. At least one of the surfaces can be a flat surface.

The outer portion 210 can include an electrical conductor pair (e.g., an electrical conductor prong 218A and an electrical conductor prong 218B, collective as the "electrical conductor prongs 218"). The electrical conductor prongs 218 can be the electrical conductor prongs 122. The electrical conductor prongs 218 can sandwich at least the inner portion 206 of the clip body 202. In various embodiments, the electrical conductor prongs 218 can penetrate the shelf coupler 214, and also the clip body 202. The electrical conductor prongs 218 are adapted to carry HVDC power.

In some embodiments, each of the electrical conductor prongs 218 includes a tip portion (e.g., the tip portion 144) with electrically conductive material exposed and a rear portion (e.g., the rear portion 146) covered by an electrical insulator. In various embodiments, wire couplers (e.g., a wire coupler 222A and a wire coupler 222B, collectively as the "wire couplers 222") can be attached to (e.g., soldered onto) the electrical conductor prongs 218. The wire couplers 222 can provide electrical connections between wires (e.g., the wires 138) to a power distribution board (e.g., the power distribution board 108) and the electrical conductor prongs 218. For example, the wire couplers 222 can include bendable metal flaps that can be pressed against the wires to secure the wires.

The outer portion 210 can include at least two clip fins (e.g., a clip fin 226A and a clip fin 226B, collectively as the "clip fins 226"). The clip fins 226 can be separated from a central stump 228. The central stump 228 can be between and spaced apart from the clip fins 226. The central stump 228 can have a narrowing tip to guide alignment of the clip fins 226 and the central stump 228 into corresponding receptacle cavities in the server rack (e.g., cavities in bus bars). The clip fins 226 can be elastic (e.g., flexible and/or bendable). For example, an object (e.g., power buses/rails of the server rack) inserted between the clip fins 226 and the central stump 228 can flex the clip fins 226. When flexed, the clip fins 226 can assert an elastic return force (e.g., spring force) to hold the power connection clip 200 against the object. For example, the clip fins 226 can have ridged surfaces to increase the frictional force that holds the power connection clip 200 to the object.

The clip fins 226 and the central stump 228 can form at least two cavities. In various embodiments, the cavities can respectively be covered by corresponding layers of electrical conductors (e.g., an electrical conductor 230A and an electrical conductor 230B, collectively as the "electrical conductors 230" (e.g., electrical contacts). The layers of the electrical conductors 230 can be electrically coupled to rear outlets (e.g., a rear outlet 232A and a rear outlet 232B, collectively as the "rear outlets 232"). In some embodiments, each of the electrical conductor layer is a metal sheet over and attached to at least part of the cavities. In some embodiments, each of the electrical conductor layer is a metallic coating or plating over at least part of the cavities. In various embodiments, the electrical conductors 230 of the cavities and the rear outlets 232 are adapted to carry IT-usable DC voltage. In various embodiments, the clip fins 226 can be spaced apart from the electrical conductor prongs 218. For example, the clip fins 226 can be spaced apart by 6 mm from the electrical conductor prongs 218. In some embodiments, a central fin structure 234 can protrude perpendicular to a flat surface shared by the central stump 228 and the clip fins 226. The central fin structure 234 can provide additional mechanical support when the power connection clip 200 is coupled to an IT equipment shelf.

Figure 3:
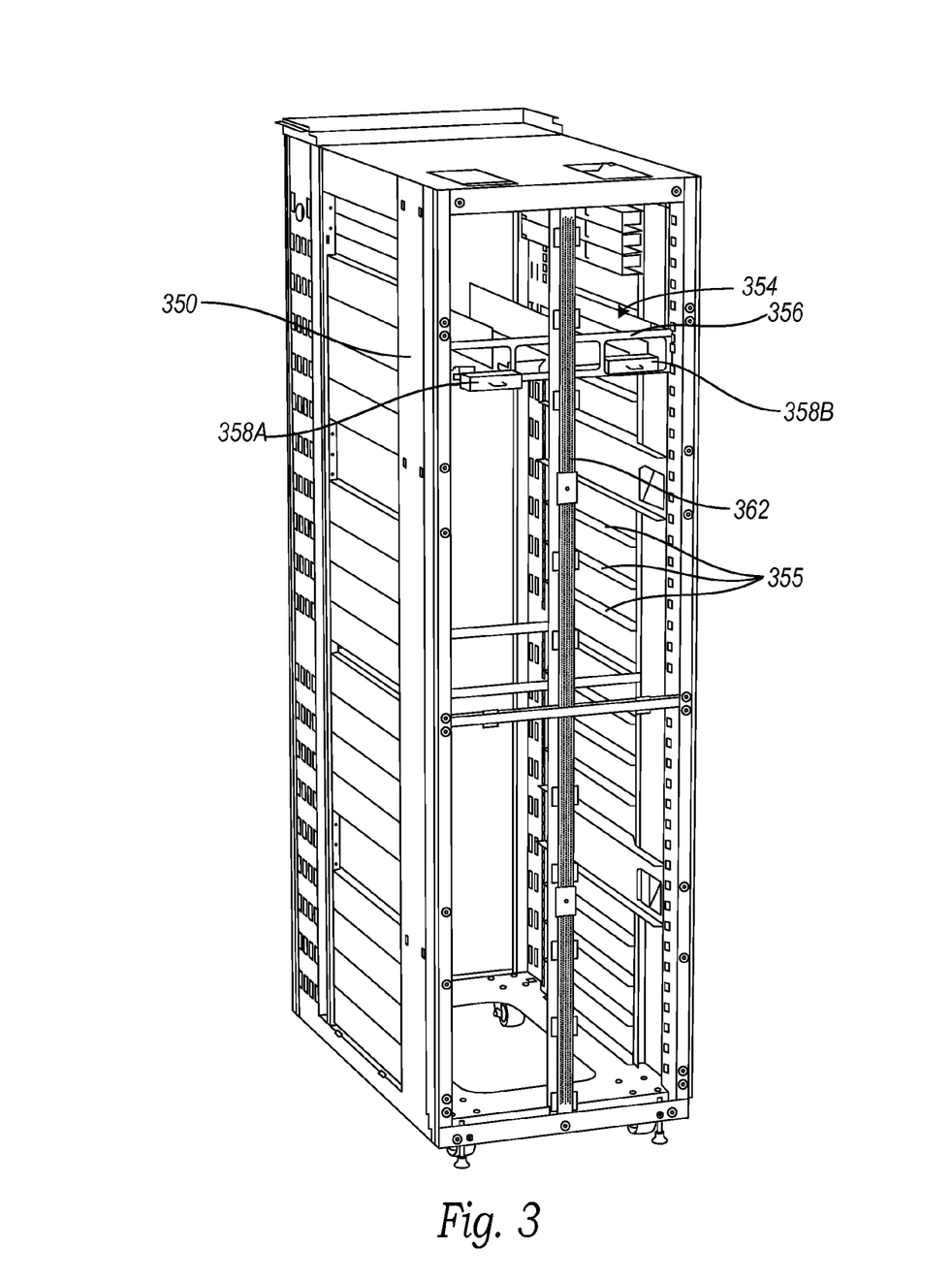
FIG. 3 is a perspective view of an example of a server rack with an IT equipment shelf inserted therein, in accordance with various embodiments.

FIG. 3 is a perspective view of an example of a server rack 300 with an IT equipment shelf (e.g., the IT equipment shelf 100) inserted therein, in accordance with various embodiments. The server rack 300 can include a rack frame 350. The rack frame 350 can provide structural support for detachable components of the server rack 300. For example, the rack frame 350 can be adapted to receive and support at least a shelf chassis 354 (e.g., chassis for the IT equipment shelf 100). The shelf chassis 354 can have the form factor of a metal tray. The server rack 300 can include a plurality of shelf slots 355 to receive shelf chasses. For example, the server rack 300 can include slots to receive up to 16 shelf chasses. For example, the rack 300 is an OCP Open Rack. For example, the shelf slot 355 is 2 Open Units high (2OU).

In the illustrated example, the shelf chassis 354 is sectioned into three compartments, each capable of fitting at least an IT device (e.g., computing server) and/or a computing accessory (e.g., network card, data storage module, cooling module, etc.). The shelf chassis 354 can include a rear panel 356 (e.g., the rear panel 102). The rear panel 356 can have openings that expose DC-DC converters (e.g., a DC-DC converter 358A and a DC-DC converter 358B, collectively as the "DC-DC converters 358"). Each of the DC-DC converters 358 can include a handle.

The rack frame 350 can include a spine structure 362 (e.g., bus-bar cage). A spine structure 362 can traverse vertically through the server rack 300 crossing over the plurality of shelf slots 355 for the shelf chasses. The spine structure 362 can provide support for power distribution conductors (e.g., HVDC power rail pair and/or IT power bus pair) of the server rack 300.

Figure 4:
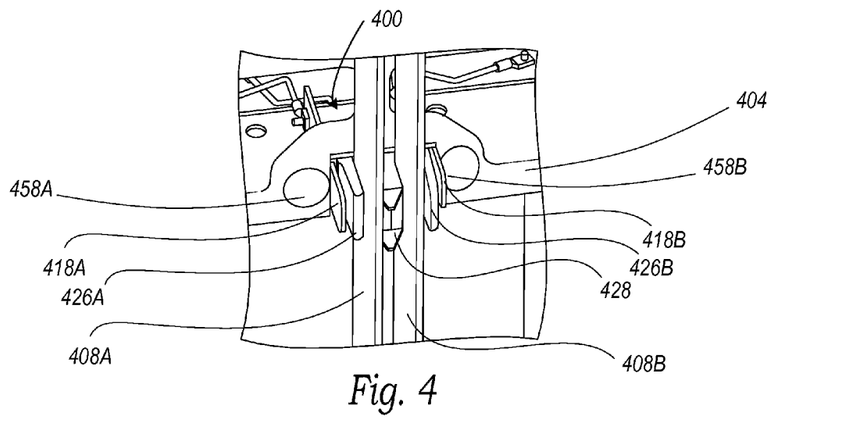
FIG. 4 is a perspective view illustrating an example of a power connection clip attached to a rear panel of a shelf chassis and coupled to a pair of power buses, in accordance with various embodiments.

FIG. 4 is a perspective view illustrating an example of a power connection clip 400 (e.g., the power connection clip 200) attached to a rear panel 404 (e.g., the rear panel 356) of a shelf chassis (e.g., the shelf chassis 354) and coupled to a pair of power buses (e.g., a first IT-usable power bus 408A and a second IT-usable power bus 408B, collectively the "IT-usable power buses 408"), in accordance with various embodiments. The IT-usable power buses 408 can be part of a frame spine of a server rack (e.g., the server rack 300). In some embodiments, the IT-usable power buses 408 can be a pair of rigid blades (e.g., metal blades) that are electrically conductive.

For example, the power connection clip 400 can include electrical conductor prongs 418A and 418B (e.g., the electrical conductor prongs 218A and 218B). The power connection clip 400 can also include clip fins 426A and 426B (e.g., the clip fins 126A and 126B). The power connection clip 400 can include a central stump 428 (e.g., the central stump 228). The insertion of the IT-usable power buses 408 into the cavities formed between the central stump 428 and the clip fins 426A and 426B can enable a mechanical coupling between the power connection clip 400 and the IT-usable power buses 408.

In some embodiments, the rear panel 404 includes at least a coupling feature for mechanically coupling with the power connection clip 400. For example, the coupling feature can be an opening 458A and an opening 458B, collective as the "openings 458." In this example, the power connection clip 400 can have holes therein that correspond to the openings 458. Rods, bolts, or screws, therefore, can be secured through the openings 458 and the holes and thus tying the power connection clip 400 to the rear panel 404.

Figure 5:
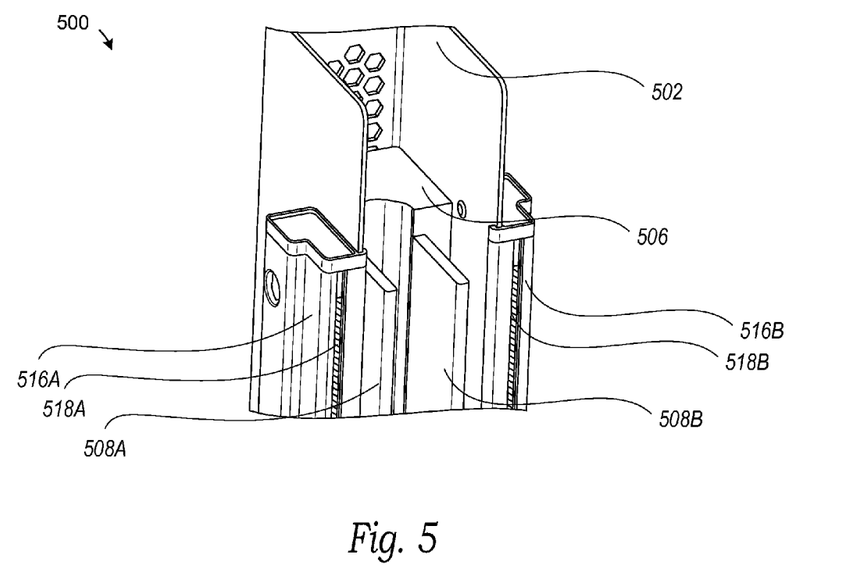
FIG. 5 is a front-side perspective view of an example of a spine structure in a server rack for power delivery, in accordance with various embodiments.

FIG. 5 is a front-side perspective view of an example of a spine structure 500 (e.g., the spine structure 362) in a server rack (e.g., the server rack 300) for power delivery, in accordance with various embodiments. In various embodiments, the spine structure 500 is adapted to couple with a power connection clip (e.g., the power connection clip 200) of an IT equipment shelf (e.g., the IT equipment shelf 100). The spine structure 500 includes a bracket 502 (e.g., bus-bar cage), a column substrate 506, connection blades (e.g., a connection blade 508A and a connection blade 508B, collectively as the "connection blades 508"), receptacle support columns (e.g., a receptacle support column 516A and a receptacle support column 516B, collectively as the "receptacle support columns 516"), receptacles (e.g., a receptacle 518A and a receptacle 518B, collectively as the "receptacles 518"), or any combination thereof. In various embodiments, the bracket 502, the column substrate 506, the connection blades 508, the receptacle support columns 516, and the receptacles 518 extend parallel to one another. The receptacle support columns 516 can serve as the HVDC power rails of the server rack.

The bracket 502 is attached to the rack frame of the server rack. For example, the bracket 502 can be composed of a metallic material. The column substrate 506 can fit at least partially within the bracket 502. For example, the column substrate can be made of plastic material. In some embodiments, the column substrate 506 do not run for the whole length of the bracket 502. For example, there can be a few instances of the column substrate 506 blocks along the whole length of the bracket 502. The column substrate 506 can provide support for the connection blades 508. The connection blades 508 can be embedded in the column substrate 506 and extend outward. The extended edges of the connection blades 508 can run parallel to each other and to the vertical surfaces of the bracket 502 and/or the column substrate 506. In various embodiments, the connection blades 508 are rigid. In some embodiments, at least the extended edges are continuously electrically conductive therethrough. In some embodiments, the connection blades 508 are metallic. For example, the connection blades 508 can be copper blades that are Nickel plated. The connection blades 508 can be 50 mm deep and 3 mm thick). In some embodiments, portions of the connection blades 508 toward the column substrate 506 can be coated with an electrical insulator to prevent electrical shorts.

The receptacle support columns 516 can be mechanically coupled to the bracket 502. For example, the receptacle support columns 516 can be attached to the exterior of the bracket 502, as shown. The receptacles 518 can be embedded in the receptacle support columns 516. The receptacles 518 can be exposed in the same direction as the opening of the bracket 502 (e.g., the direction to which the connection blades file late or extending away from the column substrate 506). The receptacles 518 can take the form of a vertical slit with electrically conducting material embedded continuously therethrough.

Figure 6:
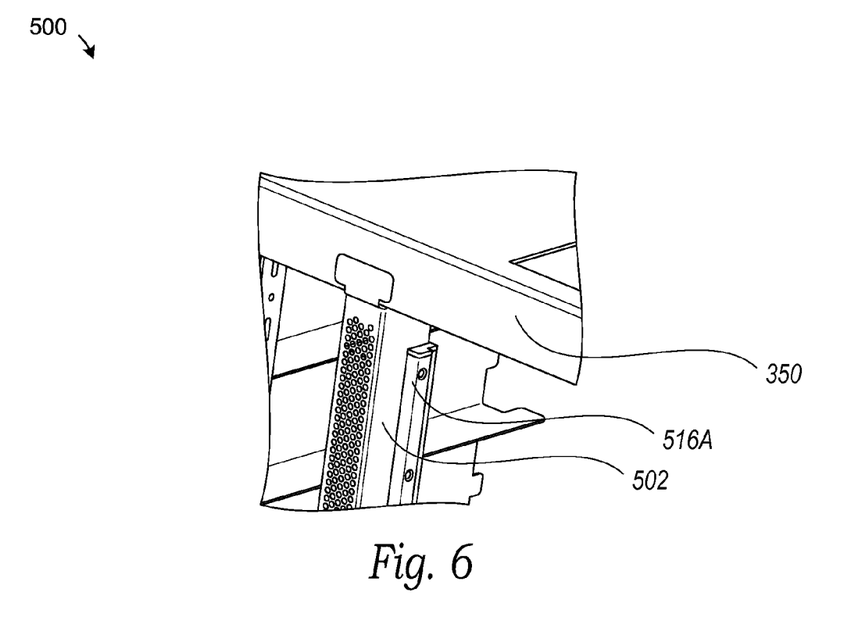
FIG. 6 is a back-side perspective view of the spine structure of FIG. 5.

FIG. 6 is a back-side perspective view of the spine structure 500 of FIG. 5. FIG. 6 illustrates a top end of the bracket 502 coupled to a bar structure at the top of a rack frame (e.g., the rack frame 350). In various embodiments, the bracket 502 partially encloses the column substrate 506 (not shown in FIG. 6) and the connection blades 508 (not shown in FIG. 6). The bracket 502 can have a plurality of holes throughout its backside. The plurality of holes can facilitate convective cooling and reduce the weight of the bracket 502. For example, the backside of the receptacle support column 516A is shown as being adjacent to the bracket 502.

Figure 7:
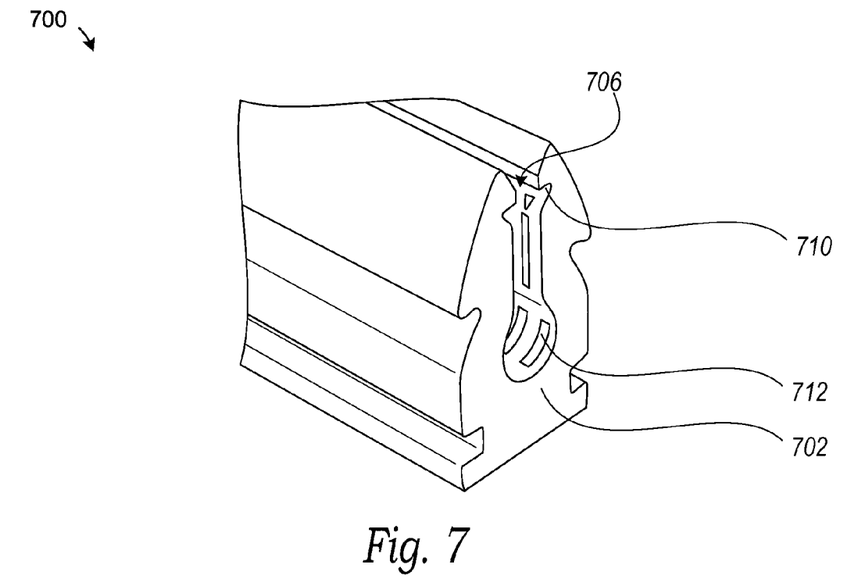
FIG. 7 is a perspective view of an example of a female receptor rail for rack power distribution, in accordance with various embodiments.

FIG. 7 is a perspective view of an example of a female receptor rail 700 used for rack power distribution (e.g., for a server rack), in accordance with various embodiments. For example, the female receptor rail 700 can be one of the receptacles 518. A receptacle body 702 can be a substrate embedded in a receptacle support column (e.g., one of the receptacle support columns 516). In some embodiments, the receptacle body 702 is composed of a soft material (e.g., rubber, soft plastic, foam, or any combination thereof). In some embodiments, the receptacle body 702 is composed of a rigid material (e.g., hard plastic, metal, alloy, or any combination thereof).

The receptacle body 702 can have a slit 706 along its length. The opening of the slit 706 extends inward and dead ends in the middle of the receptacle body 702 with the penetrating the receptacle body 702 entirely. The part of the receptacle body 702 bordering the slit 706 can be covered with an electrical conductor (e.g., metallic plating or coating) to serve as a HVDC power rail or an IT-usable DC power bus. In the example shown, the slit 706 can have a rounded dead end. In the illustrated embodiment, the slit 706 includes hook-shaped divots 710 (e.g., two divots, one on each side of the slit 706 near the top) to facilitate mechanical latching of the slit 706 to a connector object (e.g., one of the electrical conductor prongs 218) inserted into the slit 706. For example, when the connector object is inserted into the slit 706, portions of the receptacle body 702 adjacent to the slit 706 can bend and/or flex to cause the opening of the slit 706 to expand. The bending/flexing causes a mechanical force of the border of the slit 706 to hug the connector object. The mechanical force can also cause the hook-shaped cutouts to anchor onto the connector object. In some embodiments, the slit 706 can include a plurality of additional cutouts 712 to increase the friction of the slit 706 to grab onto the connector object. In some embodiments, the distance from the hook-shaped divots 710 to the external tip side of the slit 706 is high enough for a portion of HVDC blades of a power connection clip to get inside the receptacle body 702 while being electrically isolated (e.g., safe to human touch), once a power shelf is (e.g., completely) installed in the server rack. A portion of the blades of the power connection clip can be electrically isolated. A portion of the isolated portion can get inside the power rails, without reaching the metal contacts.

Figure 8:
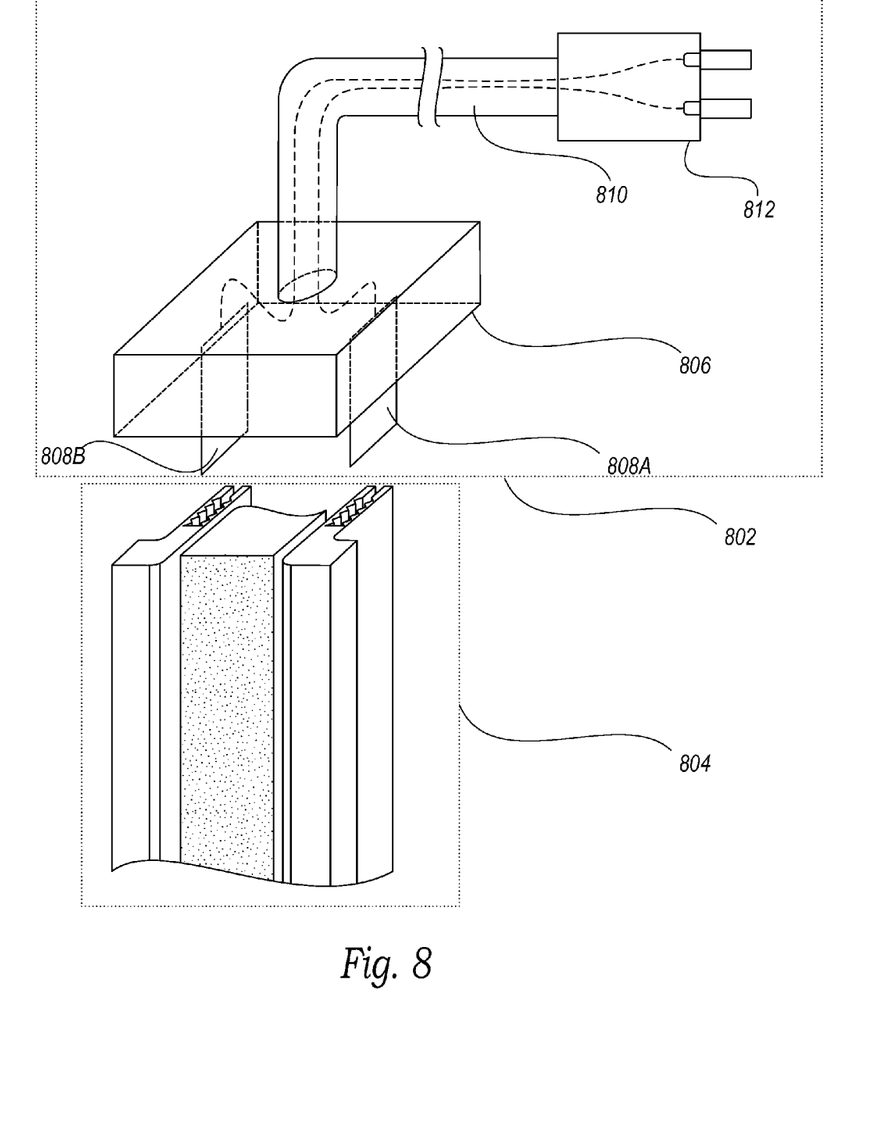
FIG. 8 is a perspective view of an example of an external HVDC power feed to HVDC power rails of a server rack, in accordance with various embodiments.

FIG. 8 is a perspective view of an example of an external HVDC power feed 802 to HVDC power rails 804 (e.g., the receptacle support columns 516 supported by the bracket 502) of a server rack, in accordance with various embodiments. The external HVDC power feed 802 can include an electrically insulating block 806 with two protruding metal bars (e.g., metal bars 808A and 808B). The metal bars 808A and 808B can be inserted on top of the HVDC power rails 804 (e.g., the receptacle support columns 516). The external HVDC power feed 802 can include a HVDC cable 810, that terminates to a HVDC socket 812 (e.g., in the power distribution of a building or a data center).

Some embodiments of the disclosure have other aspects, elements, features, and steps in addition to or in place of what is described above. These potential additions and replacements are described throughout the rest of the specification. Reference in this specification to "various embodiments" or "some embodiments" means that a particular feature, structure, or characteristic described in connection with the embodiment is included in at least one embodiment of the disclosure. Alternative embodiments (e.g., referenced as "other embodiments") are not mutually exclusive of other embodiments. Moreover, various features are described which may be exhibited by some embodiments and not by others. Similarly, various requirements are described which may be requirements for some embodiments but not other embodiments.

For example, some embodiments include a server rack system. The server rack system includes a server rack and a component positioned in the server rack. The server rack can include a frame adapted to support a plurality of components. The server rack can include a spine structure extending along the frame on one side of the plurality of components. The server rack can include a pair of receptacle columns along and attached to the spine structure. Each of the receptacle columns can include a vertical receptacle for coupling with a connection prong from a component. The server rack can include a pair of rigid connection blades along and attached to the spine structure. Each of the rigid connection blades can include an electrically conductive edge extending along the frame on at least one side of the plurality of components.

The component positioned in the server rack can include a power connection clip comprising a pair of high voltage direct current (HVDC) connection prongs and a pair of information technology (IT)-usable voltage receptors. The component can include a chassis having an end panel with an opening to receive the power connection clip. The power connection clip can extend partially through the opening of the end panel with the pair of HVDC connection prongs and the pair of IT-usable voltage receptors exposed outside of the chassis and removably connected to the receptacle columns and connection blades, respectively. The component can include a plurality of interconnects for electrically coupling HVDC power and IT-usable direct current (DC) power from the power connection clip to a power distribution board in the chassis.

What is claimed is:

1. A power connection clip for connecting an information technology (IT) equipment shelf to a server rack, comprising:
    a clip body having an inner portion and an outer portion, wherein the outer portion is adapted to protrude outside of the IT equipment shelf and the inner portion is adapted to extend inside the IT equipment shelf, wherein the outer portion includes a central stump and at least two clip fins separated from the central stump to form at least two cavities;
    wherein the inner portion of the clip body includes at least two rear outlets;
    electrical conductors respectively and at least partially covering the cavities, the electrical conductors adapted to carry a first voltage to the rear outlets;
    a shelf coupler, attached to the clip body and between the inner portion and the outer portion, adapted to mechanically couple the clip body to a wall of the IT equipment shelf; and
    a pair of electrically conductive prongs sandwiching at least part of the inner portion of the clip body and extending into the outer portion, wherein the pair of electrically conductive prongs are adapted to carry a second voltage higher than the first voltage,
        wherein each electrically conductive prong in the pair of electrically conductive prongs includes an electrically conductive tip portion extending in a direction away from the clip body and a rear portion covered by an electrical insulator.

2. The power connection clip of claim 1, wherein the electrical conductors are metallic plating or coating.

3. The power connection clip of claim 1, wherein the first voltage is IT-usable direct current (DC) voltage and the second voltage is high-voltage direct current (HVDC) voltage.

4. The power connection clip of claim 1, wherein the clip fins are adapted to flex and, when flexed, to assert an elastic return force to secure the power connection clip to an object fitted in the cavities.

5. The power connection clip of claim 1, wherein the clip fins have ridged surfaces.

6. The power connection clip of claim 1, wherein the shelf coupler is integrated with the clip body.

7. The power connection clip of claim 1, wherein the shelf coupler includes a flat surface with one or more holes adapted for use with at least a bolt or a screw to mechanically couple with the wall of the IT equipment shelf.

8. The power connection clip of claim 1, wherein the pair of electrically conductive prongs penetrate the shelf coupler or the clip body and are spaced apart from the clip fins and the central stump.

9. The power connection clip of claim 1, wherein the shelf coupler is a modular attachment mechanism adapted to mechanically couple the power connection clip to the wall of the IT equipment shelf, wherein the shelf coupler is capable of attaching and detaching from the wall of the IT equipment shelf without damaging structural material of the power connection clip or of the wall of the IT equipment shelf.

10. The power connection clip of claim 1, wherein the central stump is between and spaced apart from the clip fins.

11. The power connection clip of claim 1, wherein the central stump has a narrowing tip to guide alignment of the clip fins and the central stump into corresponding slots in the server rack.

12. A shelf adapted to fit in a server rack, comprising:
a power connection clip comprising a pair of high voltage direct current (HVDC) connection prongs and a pair of information technology (IT)-usable voltage receptors;
a chassis having an end panel with an opening to receive the power connection clip;
wherein the power connection clip is adapted to fit partially through the opening of the end panel with the pair of HVDC connection prongs and the pair of IT-usable voltage receptors exposed outside of the chassis; and
a plurality of interconnects for electrically coupling HVDC power and IT-usable direct current (DC) power from the power connection clip to a power distribution board in the chassis,
wherein a subset of the plurality of interconnects are electrically coupled to the pair of HVDC connection prongs.

13. The shelf of claim 12, wherein the power connection clip comprises a coupler plate parallel to the end panel and adapted to attach the power connection clip to the end panel.

14. The shelf of claim 12, wherein the pair of HVDC connection prongs comprise electrically conductive tips extending in a direction away from the chassis.

15. The shelf of claim 12, wherein the subset includes a wire in contact with an electrically conductive portion of at least one of the HVDC connection prongs.

16. The shelf of claim 12, wherein the power connection clip includes at least three connection prongs, wherein cavities between the connection prongs form the pair of IT-usable voltage receptors, the cavities exposing electrical conductors.

17. The shelf of claim 16, wherein the three connection prongs are electrical insulators.

18. The shelf of claim 16, wherein the power connection clip includes rear outlets electrically coupled to the exposed electrical conductors in the cavities; and wherein the plurality of interconnects include a wire in electrical contact with at least one of the rear outlets.

19. A server rack, comprising:
a frame having slots adapted to support a plurality of components;
a spine structure extending along the frame on one side of the plurality of components;
a pair of receptacle columns along and attached to the spine structure, wherein each of the receptacle columns includes a vertical receptacle for coupling with a connection prong from a component of the plurality of components, wherein the vertical receptacle includes a slit with a pair of hook-shaped divots to facilitate latching of the slit to a connector object; and
a pair of rigid connection blades along and attached to the spine structure, wherein each of the rigid connection blades includes an electrically conductive edge extending along the frame on at least one side of the plurality of components.

* * * * *